(12) United States Patent
Yoon et al.

(10) Patent No.: US 9,099,839 B1
(45) Date of Patent: Aug. 4, 2015

(54) COHERENT WAVELENGTH TUNABLE LASER APPARATUS

(71) Applicant: Electronics and Telecommunications Research Institute, Daejeon (KR)

(72) Inventors: Ki Hong Yoon, Daejeon (KR); Byung Seok Choi, Daejeon (KR); O Kyun Kwon, Daejeon (KR); Jong Sool Jeong, Daejeon (KR); Ki Soo Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/478,405

(22) Filed: Sep. 5, 2014

(30) Foreign Application Priority Data

Mar. 5, 2014 (KR) .................. 10-2014-0026055

(51) Int. Cl.
*H01S 3/10* (2006.01)
*H01S 3/1055* (2006.01)
*H01S 3/13* (2006.01)
*H01S 3/04* (2006.01)

(52) U.S. Cl.
CPC .............. *H01S 3/1055* (2013.01); *H01S 3/0401* (2013.01); *H01S 3/1307* (2013.01)

(58) Field of Classification Search
CPC ....... H01S 3/1055; H01S 3/10; H01S 3/0401; H01S 3/1307
USPC .................. 372/20; 257/E21.002; 438/31
See application file for complete search history.

(56) References Cited

U.S. PATENT DOCUMENTS

2008/0285603 A1* 11/2008 Mason et al. .................. 372/20
2010/0232458 A1* 9/2010 Kim et al. ...................... 372/20

FOREIGN PATENT DOCUMENTS

KR 10-2007-0104196 A 10/2007
KR 10-2011-0101016 A 9/2011
KR 10-2012-0047403 A 5/2012

OTHER PUBLICATIONS

Christopher F. Clarke et al., "Highly Integrated DQPSK Modules for 40 Gb/s Transmission", OFC 2009, pp. 1-3, Mar. 2009.

* cited by examiner

*Primary Examiner* — Tuan Nguyen
(74) *Attorney, Agent, or Firm* — Rabin & Berdo, P.C.

(57) ABSTRACT

Disclosed is a wavelength tunable laser apparatus, including: a first substrate configured to reflect inflow laser light, and tune a wavelength of the reflected laser light; and a second substrate configured to adjust a gain of the laser light input from the first substrate, reflect a specific wavelength of the laser light, and adjust a phase of oscillated laser light, in which the first substrate and the second substrate are formed in a single package form.

10 Claims, 4 Drawing Sheets

COHERENT WAVELENGTH TUNABLE LASER APPARATUS

CROSS-REFERENCE TO RELATED APPLICATION

This application is based on and claims priority from Korean Patent Application No. 10-2014-0026055, filed on Mar. 5, 2014, with the Korean Intellectual Property Office, the disclosure of which is incorporated herein in its entirety by reference.

BACKGROUND

1. Field

The present invention relates to a coherent wavelength tunable laser apparatus, and more particularly, to a coherent wavelength tunable laser apparatus, which is capable of generating an external cavity wavelength tunable laser, modulating a phase of the generated laser, and being formed in a single package form.

2. Discussion of Related Art

Currently, an optical communication system, such as a Dense Wavelength Division Multiplexing (DWDM) optical communication system, adopts an amplitude modulation method of determining whether an optical signal is present and determining a result of the determination as 1 or 0 as a high speed optical modulation method. The amplitude modulation method modulates an optical signal output from a laser device by using an external Electro-Absorption Modulator (EAM) or an external Mach-Zhender modulator. However, the amplitude modulation method has a problem in that a modulation speed is increased, a width of a laser spectrum is also increased. The increase in the width of the laser spectrum has a disadvantage in that noise power is increased, and a range of full speed is limited due to a problem of color distribution of an optical fiber.

In order to overcome the disadvantage of the amplitude modulation method, a phase modulation method is introduced in order to improve a transmission speed. The most representative method of the phase modulation methods is Differential Phase Shift Keying (DPSK) of determining phases of 0° and 180° and determining the determined phase as 1 or 0. The DPSK using a difference between the two phases has the same transmission speed as that of the amplitude modulation. However, when Differential Quadrature Phase Shift Keying (DQPSK) of increasing a transmission speed by two times by making a phase difference have 90° is introduced, there is an advantage in that the transmission speed may be increased by two times at the same modulation speed, but an external optical modulator formed of two or more Mach-Zhender modulators is required in order to modulate a phase.

In the meantime, a laser is configured to use two reflectors for a laser cavity, and provide a gain by providing an optical gain unit between the two reflectors. In this case, a distance between the two reflectors is a cavity length. The optical communication system using the phase modulation method requires a laser light source having a very small line width, and the line width of the laser is decreased as the cavity length for configuring the laser is increased. Accordingly, the optical communication system using the phase modulation method requires a cavity laser device having a long cavity length.

Further, the optical communication system wishes to use a tunable laser device capable of flexibly using a wavelength band of a laser. In general, a wavelength tunable laser apparatus may be divided into a "single integrated wavelength tunable laser apparatus" in which an optical gain unit, a reflector, and elements for tuning a wavelength are formed on chips formed of the same medium, and an "external cavity wavelength tunable laser apparatus", in which an optical gain unit and a wavelength tunable reflecting unit for tuning a wavelength are formed on chips formed of different media, respectively, and the two media are combined. Among them, the "external cavity wavelength tunable laser apparatus" has a longer cavity length than that of the "single integrated wavelength tunable laser apparatus", and thus may have a considerably small line width according to the long cavity length. Accordingly, the "external cavity wavelength tunable laser apparatus" is more appropriate for a light source of the optical communication system using the phase modulation method.

However, the inventions in the related art adopt a method of separately manufacturing a package of a wavelength tunable laser apparatus and a package of a phase modulator, and then connecting the two packages through an optical fiber, so that there is a problem in that a volume of the wavelength tunable laser apparatus is increased, a structure of the package is complicated, and cost is increased.

Accordingly, in order to solve the problem and more improve performance of the wavelength tunable laser apparatus, development of a new technology has been demanded.

SUMMARY

The present invention has been made in an effort to provide a wavelength tunable laser apparatus in a single package form, which is capable of tuning a wavelength and modulating a phase.

In the meantime, technical objects to be achieved by the present invention are not limited to the aforementioned objects, and may include various technical objects within the scope apparent to those skilled in the art from the contents to be described below.

An exemplary embodiment of the present invention provides a wavelength tunable laser apparatus, including: a first substrate configured to reflect inflow laser light, and tune a wavelength of the reflected laser light; and a second substrate configured to adjust a gain of the laser light input from the first substrate, reflect a specific wavelength of the laser light, and adjust a phase of oscillated laser light, in which the first substrate and the second substrate are formed in a single package form.

Further, the first substrate may include a wavelength tunable reflection unit configured to reflect laser light entering from the outside, and select and tune a wavelength of the reflected laser light.

Further, the second substrate may include: an optical gain unit configured to adjust a gain of the laser light input from the first substrate; a ring resonator unit configured to reflect a specific wavelength of the laser light transmitted from the optical gaining unit, and output the laser light to a phase modulation unit; and a phase modulation unit configured to modulate a phase of the laser light output from the ring resonator unit.

Further, the ring resonator unit may include a ring-shaped waveguide and an optical coupler, and the optical coupler includes a gap coupler, a 50:50 optical coupler, or an inclined coupler.

Further, the second substrate may further include an optical distribution unit configured to distribute the laser light transmitted from the optical gaining unit, and the ring resonator unit may include a plurality of input terminals for receiving the signal distributed from the optical distribution unit, and a plurality of output terminals for outputting the signal.

Further, the plurality of output terminals may include a first output terminal and a second output terminal, and the phase modulation unit may include: a first modulation unit configured to modulate a signal of the first output terminal; and a second modulation unit configured to modulate a signal of the second output terminal.

Further, the first modulation unit may divide the signal of the first output terminal into a plurality of signals, and modulate the plurality of signals to have different phases.

Further, the second modulation unit may divide the signal of the second output terminal into a plurality of signals, and modulate the plurality of signals to have different phases.

Further, the wavelength tunable laser apparatus may further include a polarization control unit configured to control polarization of the signal modulated by the first modulation unit or the signal modulated by the second modulation unit.

Further, the polarization control unit may be formed on a third substrate, and the first substrate, the second substrate, and the third substrate may be formed in a single package form.

Further, the substrates may be coupled by using a lens or an adhesive.

Further, a thermo-electric cooler for controlling temperatures of the substrates may be mounted under the substrates.

According to the exemplary embodiments of the present invention, the present invention may provide the wavelength tunable laser apparatus in a "single package form", which may "provide a small line width, tune a wavelength and modulate a phase. Particularly, the present invention may provide the wavelength tunable laser apparatus for forming a phase modulation unit in one of substrates for implementing an external wavelength tunable laser, and then forming the substrates in the single package form.

Further, the present invention may reduce the number of optical distribution elements, compared to the inventions in the related art. Particularly, the present invention may perform the phase modulation operation by using a plurality of signals output by the ring resonator unit, thereby being configured in a form using the less number of optical distribution elements (optical distribution units) compared to the related art.

Further, the present invention may also provide the wavelength tunable laser apparatus in a "single package form", which may "provide a small line width, tune a wavelength, modulate a phase, and further improve a transmission speed through polarization". Particularly, the present invention may provide the wavelength tunable laser apparatus by forming the first substrate and the second substrate, on which the external wavelength tunable laser and the phase modulation unit are implemented, and the third substrate, on which the polarization control unit is implemented, in a single package form.

Further, the present invention may stabilize an output of a laser through a control of a temperature. Particularly, the present invention may control a temperature by installing a Thermo-Electric Cooler (TEC) under the single-packaged substrates, thereby stabilizing an output of the laser.

In the meantime, the effects of the present invention are mot limited to the aforementioned effects, and may include various effects within the scope apparent to those skilled in the art from the contents to be described below.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Hereinafter, a "wavelength tunable laser apparatus" according to the present invention will be described with reference to the accompanying drawings in detail. Described exemplary embodiments are provided so that those skilled in the art may easily understand the technical spirit of the present invention, so that the present invention is not limited by the exemplary embodiments. Further, matters in the accompanying drawings are illustrated for easily describing the exemplary embodiments of the present invention, and may be different from actually implemented forms.

In the meantime, each element expressed below is an example for implementing the present invention. Accordingly, in another implementation of the present invention, another element may be used without departing from the spirit and the scope of the present invention.

Further, an expression "including elements" is an open expression, and simply indicates that corresponding elements exist, and shall not be understood that additional elements are excluded.

Further, expressions, such as "a first, a second, a third, a first-1, a first-2, a first-3, a first-4, a first-5, a first-6, a second-1, a second-2, a second-3, a second-4, a second-5, and a second-6, are expressions used for discriminating a plurality of elements, and do not limit an order of the elements or other characteristics.

Hereinafter, a wavelength tunable laser apparatus according to an exemplary embodiment of the present invention will be described with reference to FIGS. 1 to 2.

Figure 1:
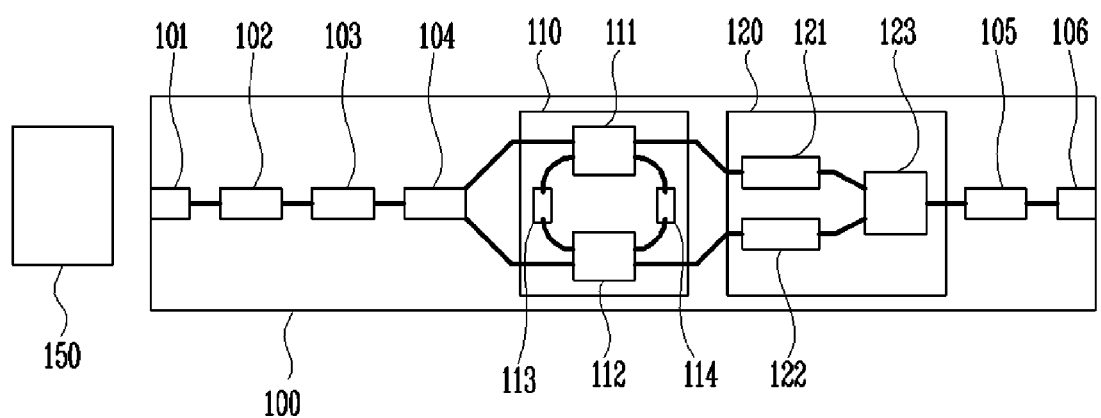
FIG. 1 is a diagram illustrating a configuration of a wavelength tunable laser apparatus according to an exemplary embodiment of the present invention.

Referring to FIG. 1, a wavelength tunable laser apparatus according to the exemplary embodiment of the present invention may include a first substrate 150 for reflecting inflow laser light and tuning a wavelength of the reflected laser light, and a second substrate 100 for adjusting a gain of the laser light input from the first substrate 150, reflect a specific wavelength of the laser light, and adjust oscillated laser light.

Here, the first substrate 150 and the second substrate 100 may be formed of different media, and may be formed in a single package form through a lens, an adhesive, or the like.

The wavelength tunable laser apparatus according to the exemplary embodiment of the present invention may perform all of "an operation of generating laser light with a small line width", "an operation of tuning a wavelength of laser light", and "an operation of modulating a phase" by using the first substrate 150 and the second substrate 100 formed in the single package form.

The first substrate 150 may include an external wavelength tunable reflection unit. Here, the external wavelength tunable reflection unit is a configuration of reflecting laser light entering from the outside, and selecting and tuning a wavelength of the reflected laser light. Further, the external wavelength tunable reflection unit may include a polymer grating, and may reflect a specific wavelength by using the polymer grating.

Here, the 200 may include a first mode matching unit 101, a phase shift unit 102, an optical gain unit 103, an optical distribution unit 104, a ring resonator unit 110, a phase modulation unit 120, an optical amplification unit 105, and a second mode matching unit 106.

The first mode matching unit 101 is a configuration of receiving the laser light from the first substrate 150. The first mode matching unit 101 serves to receive the laser light from the first substrate 150, and match a mode of the received laser light.

The phase shift unit 102 is a configuration of adjusting a phase of the laser light input through the first mode matching unit 101.

The optical gain unit 103 is a configuration of adjusting a gain of the laser light transmitted from the phase shift unit 102.

The optical distribution unit 104 is a configuration of distributing the laser light transmitted from the optical gain unit 103 into a plurality of optical signals.

The ring resonator unit 110 is a configuration of reflecting a signal, which is resonated with a specific wavelength interval, to the optical gain unit 103, and output the oscillated laser light to an output terminal.

The ring resonator unit 110 may include a plurality of optical couplers 111 and 112 and a ring-shaped waveguide for feeding back components of a specific frequency to the optical gain unit 103, and may include a plurality of input units connected with the optical distribution unit 104, a plurality of output terminals connected with the phase modulation unit 120, and a plurality of ring resonance phase units 113 and 114 for tuning an output wavelength of the laser light through application of electricity. Further, the plurality of output ends may include a first output terminal and a second output terminal, and the same output signal may be generated through the first output terminal and the second output terminal.

Figure 2:
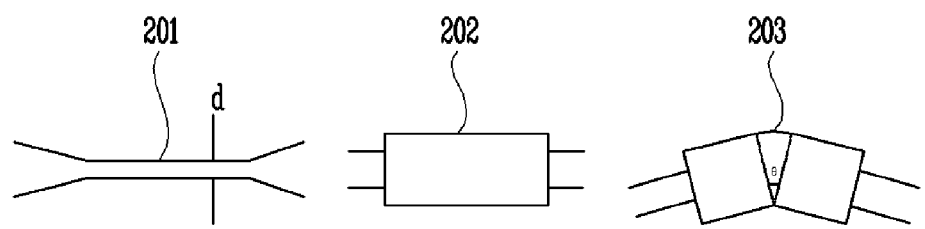
FIG. 2 is a diagram illustrating examples of an optical coupler, which may be included in a ring resonator unit.

In the meantime, the plurality of optical couplers 111 and 112, which may be included in the ring resonator unit 110, may be implemented in a form including a gap coupler 201, a 50:50 optical coupler 202, and an inclined coupler 203 as illustrated in FIG. 2. Particularly, each of the optical coupler 111 or 112 may be implemented in a form including one, or two or more of the gap coupler 201, the 50:50 optical coupler 202, and the inclined coupler 203. Here, the gap coupler 201 is a coupler in which a coupling ratio is different according to an interval between two waveguides, the 50:50 optical coupler 202 is a coupler in which a ratio of outputs of the two output terminals is 50:50, and the inclined coupler 203 is a coupler in which a coupling ratio is different according to an inclination angle θ. Accordingly, the ring resonator unit 110 may adjust power distribution within the ring resonator unit 110, and control a ring resonance property by using the optical couplers 111 and 112.

The phase modulation unit 120 is a configuration, which is connected with the plurality of output terminals of the ring resonator unit 110 to receive a plurality of output signals from the ring resonator unit 110, and modulate phases of the received signals. For example, the phase modulation unit 120 may be connected with the two output terminals included in the ring resonator unit 110, and modulate the phases of the signals transmitted through the two output terminals. To this end, the phase modulation unit 120 may be configured in a form including a first modulation unit 121, a second modulation unit 122, and an optical coupler 123, and here, the first modulation unit 121 is a configuration of modulating the phase of the output signal transmitted from the first output terminal of the ring resonator unit 110, the second modulation unit 122 is a configuration of modulating the phase of the output signal transmitted from the second output terminal of the ring resonator unit 110, and the optical coupler 123 is a combination of coupling the optical signals, of which the phases are modulated by the first modulation unit 121 and the second modulation unit 122. The phase modulation unit 120 may differently modulate the phases of the two output signals transmitted from the ring resonator unit 110 by using the first modulation unit 121 and the second modulation unit 122, and thus the DPSK may be implemented by this modulation.

In the meantime, the phase modulation unit 120 may be implemented by various optical modulators including a Mach-Zhender modulator.

The optical amplification unit 105 is a configuration of amplifying the laser light transmitted from the phase shift unit 120.

The second mode matching unit 106 is a configuration of shifting a mode of the laser light transmitted from the optical amplification unit 105. Particularly, the second mode matching unit 106 is a configuration of converting the asymmetric laser light transmitted from the optical amplification unit 105 to be appropriate to a size of a mode of an optical fiber.

The aforementioned wavelength tunable laser apparatus according to the exemplary embodiment of the present invention may oscillate laser light with a small line width, tune a wavelength of laser light, and modulate a phase of laser light by using the first substrate 150 and the second substrate 100 formed in the single package form. Particularly, the wavelength tunable laser apparatus may oscillate laser light and tune a wavelength of laser light by using the wavelength tunable reflection unit formed on the first substrate 150, and the optical gain unit 103, the optical distribution unit 104, and the optical resonation unit 110 formed on the second substrate 100, and implement laser light with a small line width by using a long cavity distance between the first substrate 150 and the second substrate 100. Further, the wavelength tunable laser apparatus may module a phase of oscillated laser light by using the phase modulation unit 120 formed to be connected with the ring resonator unit 110.

Further, in the wavelength tunable laser apparatus according to the exemplary embodiment of the present invention, the phase modulation unit 120 is formed in a form, which is embedded in the second substrate 100, and receive a plurality of output signals from the ring resonator unit 110, so that even though the phase modulation unit 120 does not autonomously include the optical distribution unit, the wavelength tunable laser apparatus may utilize the plurality of optical signals.

Hereinafter, a wavelength tunable laser apparatus according to another exemplary embodiment of the present invention will be described with reference to FIG. 3.

Figure 3:
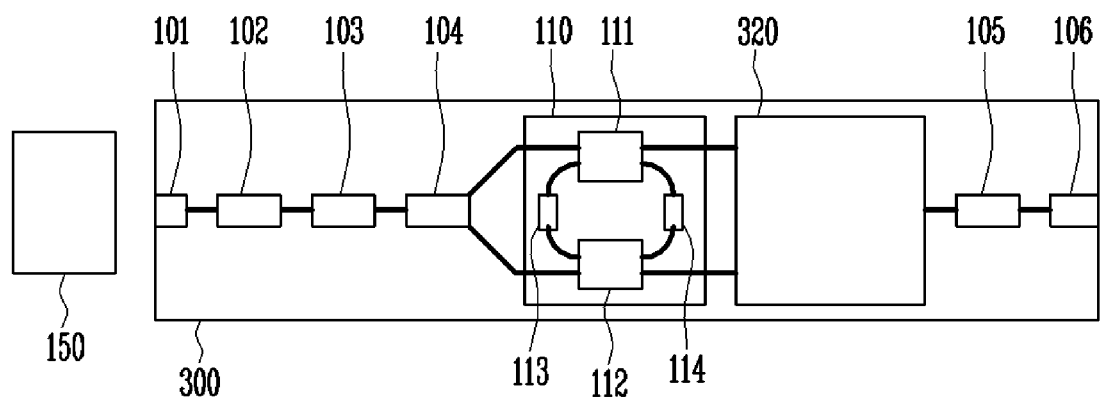
FIG. 3 is a diagram illustrating a configuration of a wavelength tunable laser apparatus according to another exemplary embodiment of the present invention.
Figure 3:
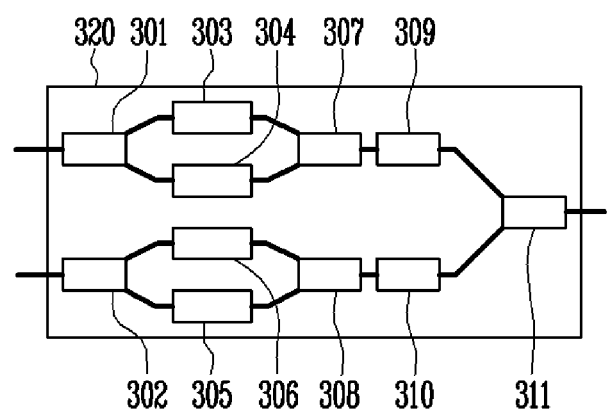

The wavelength tunable laser apparatus according to another exemplary embodiment of the present invention to be described with reference to FIG. 3 is an exemplary embodiment in which the configuration of the "phase modulation unit" is modified in order to improve a transmission speed of the aforementioned wavelength tunable laser apparatus according to the exemplary embodiment of the present invention.

Accordingly, the configurations, other than the "phase modulation unit" are the same as those of FIG. 1, and a modified phase modulation unit 320 will be mainly described below.

Referring to FIG. 3, the phase modulation unit 320 according to another exemplary embodiment of the present invention may be formed on a second substrate 300, and may include first modulation units 301, 303, 304, 307, and 309 connected with the first output terminal of the ring resonator unit 110, second modulation units 302, 305, 306, 308, and 310 connected with the second output terminal of the ring resonator unit 110, and an optical coupler 311 for coupling signals modulated by the first modulation units and the second modulation units.

The phase modulation unit 320 according to another exemplary embodiment of the present invention may implement the DQPSK, which uses four different phase states, by using the phase modulation unit 320, and may implement a two times transmission speed of the transmission speed of FIG. 1.

The first modulation units may include an optical distribution unit 301 for distributing an optical signal transmitted from the first output terminal of the ring resonator unit 110, a first-1 modulator 303 for modulating a phase of a first-1 optical signal distributed by the optical distribution unit 301, a first-2 modulator 304 for modulating a phase of a first-2 optical signal distributed by the optical distribution unit 301, an optical coupler 307 for optically coupling the first-1 optical signal and the first-2 optical signal, of which the phases are modulated, and a third-3 modulator 309 for secondarily modulating the phases of the first-1 optical signal and the first-2 optical signal after the optical coupling.

The second modulation units may include an optical distribution unit 302 for distributing an optical signal transmitted from the second output terminal of the ring resonator unit 110, a second-1 modulator 305 for modulating a phase of a second-1 optical signal distributed by the optical distribution unit 302, a second-2 modulator 306 for modulating a phase of a second-2 optical signal distributed by the optical distribution unit 302, an optical coupler 308 for optically coupling the second-1 optical signal and the second-2 optical signal, of which the phases are modulated, and a second-3 modulator 310 for secondarily modulating the phases of the second-1 optical signal and the second-2 optical signal after the optical coupling.

The phase modulation unit 320 may implement the optical signals having four different phase states by using the first modulation units and the second modulation units. Particularly, the phase modulation unit 320 may 1) make the phase of the first-1 optical signal be different from the phase of the first-2 optical signal by using the first-1 modulator 303 and the first-2 modulator 304, 2) make the phase of the second-1 optical signal be different from the phase of the second-2 optical signal by using the second-1 modulator 305 and the second-2 modulator 306, and 3) make the phases of the first-1 optical signal/first-2 optical signal be different from the phases of the second-2 optical signal/second-2 optical signal by using the first-3 modulator 309 and the second-3 modulator 310. Accordingly, the optical signals having the four different phase states may be implemented through the aforementioned processes.

The optical coupler 311 is a configuration of coupling the optical signals modulated by the first modulation units and the second modulation units. That is, the optical coupler 311 is a configuration of coupling the optical signals having the different phase states generated by the first modulation units and the second modulation units.

As a result, the wavelength tunable laser apparatus according to another exemplary embodiment of the present invention may oscillate laser light with a small line width, tune a wavelength of laser light, and modulate a phase of laser light. Further, the wavelength tunable laser apparatus according to another exemplary embodiment of the present invention may use four different phase states, thereby implementing the DQPSK.

Further, in the wavelength tunable laser apparatus according to another exemplary embodiment of the present invention, even though a first optical distribution unit (optical distributing unit) is not installed in the phase modulation unit, the plurality of optical signals is transmitted to the phase modulation unit through the output terminal of the ring resonator unit, thereby decreasing use of an optical distributor element.

In the meantime, the wavelength tunable laser apparatus according to the present invention may expand the phase modulation unit into various forms, in addition to the example illustrated in FIG. 3. For example, the wavelength tunable laser apparatus according to the present invention may also generate optical signals having five or more phase states by configuring the phase modulation unit in a form including the more number of optical distribution units, phase distribution units, and optical couplers.

Hereinafter, a particular example, in which the aforementioned wavelength tunable laser apparatuses are formed in a single package form will be described with reference to FIG. 4.

Figure 4:
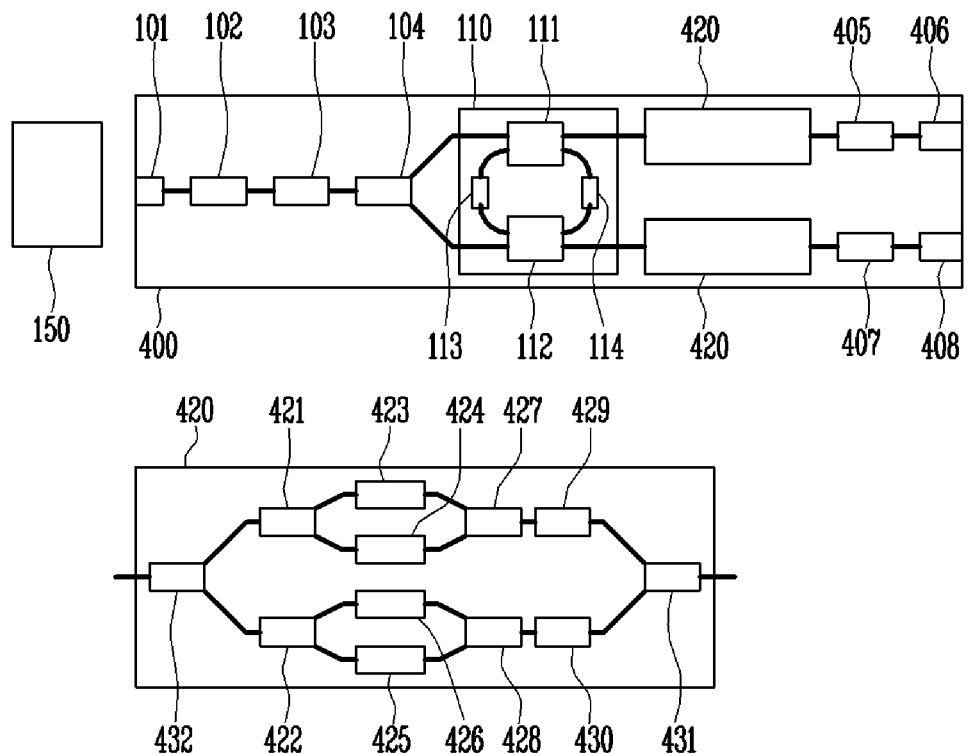
FIG. 4 is a diagram illustrating an example of a single package of the wavelength tunable laser of FIG. 1 or 3.

Referring to FIG. 4, it can be seen that the first substrate 150 and a second substrate 501 are formed in a single package form. Here, the second substrate 501 may be the second substrate 100 described with reference to FIG. 1 or the second substrate 300 described with reference to FIG. 3, and may be a second substrate formed in various forms.

The first substrate 150 and the second substrate 501 may be optically coupled in the single package form through a lens 530. Further, the first substrate 150 and the second substrate 501 may be coupled in a bonded form by using an UV epoxy adhesive. In the meantime, the second substrate may also be packaged in a form mounted in a platform 511.

Further, a Thermo-Electric Cooler (TEC) 520 may be formed under the first substrate 150 and the second substrate 501. Temperatures of the substrate may be controlled through the TEC 520, and an output of the laser light may be stabilized.

In the meantime, the laser light output by the first substrate 150 and the second substrate 501, which are formed in the single package form, may be output to the outside though an optical fiber 503. In this case, the first substrate 150 and the second substrate 501 may be optically coupled with the optical fiber through the lens 502, and maximize optical coupling efficiency, and minimize a coupling deviation.

Hereinafter, a wavelength tunable laser apparatus according to yet another exemplary embodiment of the present invention will be described with reference to FIGS. 5 to 6.

The wavelength tunable laser apparatus according to yet another exemplary embodiment of the present invention may perform even a "polarization control" operation in addition to the "phase modulation" operation in order to implement a higher transmission speed compared to the aforementioned wavelength tunable laser apparatuses.

To this end, the wavelength tunable laser apparatus according to yet another exemplary embodiment of the present invention may additionally include a third substrate, on which a polarization control unit is formed, and the third substrate may also be formed in a single package form together with the first substrate and the second substrate.

Accordingly, the wavelength tunable laser apparatus according to yet another exemplary embodiment of the present invention may perform all of "the operation of generating laser light with a small line width", "the operation of tuning a wavelength of laser light", and "the operation of modulating a phase" by using the first substrate, the second substrate, and the third substrate formed in the single package form.

The first substrate and the second substrate, which may be included in the wavelength tunable laser apparatus according to yet another exemplary embodiment of the present invention will be described with reference to FIG. 5.

Figure 5:
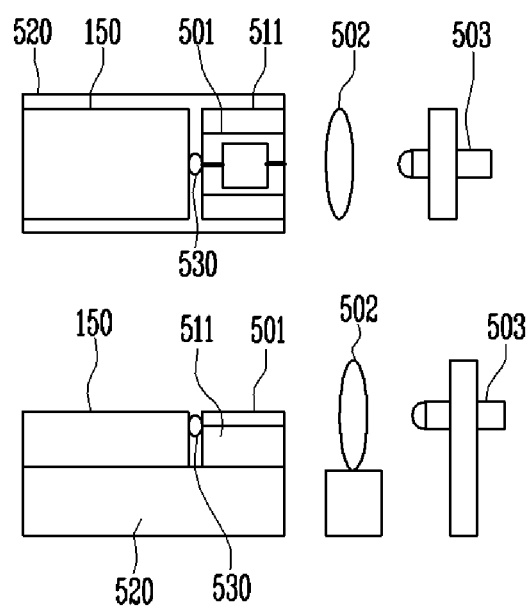
FIG. 5 is a diagram illustrating a configuration of a wavelength tunable laser apparatus according to yet another exemplary embodiment of the present invention.
Figure 6:
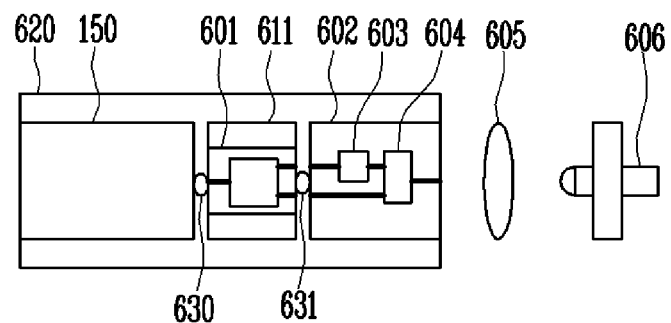
FIG. 6 is a diagram illustrating an example of a single package of the wavelength tunable laser of FIG. 5.
Figure 6:
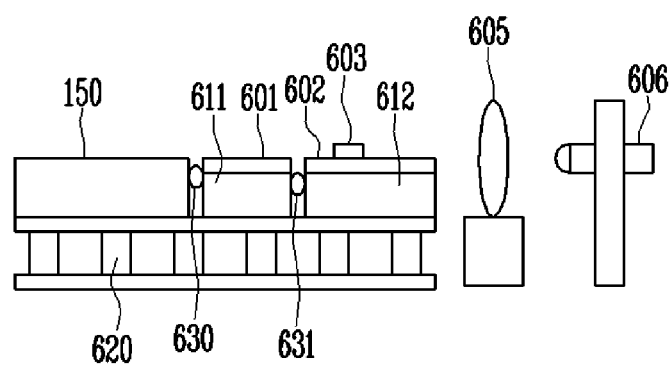

For reference, FIG. 5 simply illustrates a particular example, in which eight optical signals, which are separated from each other, are generated (the transmission speed is two times compared to the example of FIG. 3) through the "phase modulation" and the "polarization control". Accordingly, the wavelength tunable laser apparatus according to yet another exemplary embodiment of the present invention is not limited by the example, and may also include a first substrate and a second substrate having different forms.

Referring to FIG. 5, the wavelength tunable laser apparatus according to yet another exemplary embodiment of the present invention may include a first substrate 150 and a second substrate 400. Here, the configurations from the first substrate 150 to the ring resonator unit 110 of the second substrate 400 are the same as those of the aforementioned exemplary embodiments, so that detailed descriptions thereof will be omitted, and configurations after the phase modulation unit will be described.

The phase modulation unit according to yet another exemplary embodiment of the present invention may include a first modulation unit 420 connected with the first output terminal of the ring resonator unit 110, and a second modulation unit 440 connected with the second output terminal of the ring resonator unit 110. Here, optical signals output by the first modulation unit 420 and the second modulation unit 440 may be amplified by optical amplification units 405 and 407, respectively, and may be output after being mode-matched by mode matching units 406 and 408.

The first modulation unit 420 may include an optical distribution unit 432 for first distributing the optical signal transmitted from the output terminal of the ring resonator unit 110, optical distribution units 421 and 422 for secondarily distributing the optical signals distributed by the optical distribution unit 432, a first-1 modulator 423 for modulating a first-1 optical signal distributed by the optical distribution unit 421, a first-2 modulator 424 for modulating a first-2 optical signal distributed by the optical distribution unit 421, a first-3 modulator 425 for modulating a first-3 optical signal distributed by the optical distribution unit 422, a first-4 modulator 426 for modulating a first-4 optical signal distributed by the optical distribution unit 422, an optical coupler 427 for coupling the first-1 optical signal and the first-2 optical signal, of which the phases are modulated, an optical coupler 428 for coupling the first-3 optical signal and the first-4 optical signal, of which the phases are modulated, a first-5 modulator 429 for secondarily modulating the first-1 optical signal and the first-2 optical signal after the optical coupling, a first-6 modulator 430 for secondarily modulating the first-3 optical signal and the first-4 optical signal after the optical coupling, and an optical coupler 432 for coupling the optical signals modulated by the 1-5 modulator and the first-6 modulator. Accordingly, the first modulation unit 420 may output the four optical signals having different phase states by using the aforementioned configurations.

The second modulation unit 440 may substantially include the same configuration as that of the first modulation unit 420. Accordingly, the second modulation unit 440 may also generate four optical signals having the same phase states as those of the first modulation unit 420.

In the meantime, "the optical signals generated by the first modulation unit 420" and "the optical signals generated by the second modulation unit 440" may be separated from each other through the polarization control unit formed on the third substrate even though the phases states of "the optical signals generated by the first modulation unit 420" and "the optical signals generated by the second modulation unit 440" are different, and may be optically coupled after the polarization control.

As a result, the wavelength tunable laser apparatus according to yet another exemplary embodiment of the present invention may generate eight optical signals, which are separated from each other, through the "phase modulation" operation and the "polarization control" operation, and may improve the transmitted speed by two times compared to that of the DQPSK.

A particular example, in which the first substrate 150, a second substrate 601, and a third substrate 602 are formed in a single package form, will be described with reference to FIG. 6.

Here, the first substrate 150 may be configured in a form including an external wavelength tunable reflection unit. Further, the second substrate 601 may be formed in the form of the aforementioned second substrate 400, or in a different form. Further, the third substrate 602 may be formed in a form including a polarization control unit 603 and an optical coupler 604, and may adjust optical signals transmitted from the second substrate 61 (for example, the signal modulated by the first modulation unit or the signal modulated by the second modulation unit) to be in different polarization states, and then optically couple the optical signals.

The first substrate 150, the second substrate 601, and the third substrate 602 may be optically coupled to each other through the UV epoxy adhesive or lens 630 and 631, and may be formed in the form of the single package through the coupling. Further, the second substrate 601 and the third substrate 602 may be formed in a state of being mounted in platforms 611 and 612, respectively, and may be single-packaged in this state.

Further, a thermo-Electric Cooler (TEC) 620 may be formed under the first substrate 150, the second substrate 601, and the third substrate 602. Temperatures of the substrate may be controlled through the TEC 620, and an output of the laser light may be stabilized.

In the meantime, the laser light output by the first substrate 150, the second substrate 601, and the third substrate 602 which are formed in the single package form, may be output to the outside though an optical fiber 606. In this case, the first substrate 150, the second substrate 601, and the third substrate 602 may be optically coupled with the optical fiber through the lens 605, and maximize optical coupling efficiency, and minimize a coupling deviation.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A wavelength tunable laser apparatus, comprising:
a first substrate configured to reflect inflow laser light, and tune a wavelength of the reflected laser light, the first substrate including a wavelength tunable reflection unit configured to reflect laser light entering from the outside, and select and tune a wavelength of the reflected laser light; and
a second substrate configured to adjust a gain of the laser light input from the first substrate, reflect a specific wavelength of the laser light, and adjust a phase of oscillated laser light, the second substrate including:
an optical gain unit configured to adjust a gain of the laser light input from the first substrate;
a ring resonator unit configured to reflect a specific wavelength of the laser light transmitted from the optical gain unit, and output the laser light to a phase modulation unit; and
a phase modulation unit configured to modulate a phase of the laser light output from the ring resonator unit,
wherein the first substrate and the second substrate are formed in a single package form.

2. The wavelength tunable laser apparatus of claim 1, wherein the ring resonator unit includes a ring-shaped waveguide and an optical coupler, and
the optical coupler includes a gap coupler, a 50:50 optical coupler, or an inclined coupler.

3. The wavelength tunable laser apparatus of claim 1, wherein the second substrate further includes an optical distribution unit configured to distribute the laser light transmitted from the optical gain unit, and
the ring resonator unit includes a plurality of input terminals for receiving the signal distributed from the optical distribution unit, and a plurality of output terminals for outputting the signal.

4. The wavelength tunable laser apparatus of claim 3, wherein the plurality of output terminals includes a first output terminal and a second output terminal, and
the phase modulation unit includes:
a first modulation unit configured to modulate a signal of the first output terminal; and
a second modulation unit configured to modulate a signal of the second output terminal.

5. The wavelength tunable laser apparatus of claim 4, wherein the first modulation unit divides the signal of the first output terminal into a plurality of signals, and modulates the plurality of signals to have different phases.

6. The wavelength tunable laser apparatus of claim 4, wherein the second modulation unit divides the signal of the second output terminal into a plurality of signals, and modulates the plurality of signals to have different phases.

7. The wavelength tunable laser apparatus of claim 4, further comprising:
a polarization control unit configured to control polarization of the signal modulated by the first modulation unit or the signal modulated by the second modulation unit.

8. The wavelength tunable laser apparatus of claim 7, wherein the polarization control unit is formed on a third substrate, and
the first substrate, the second substrate, and the third substrate are formed in a single package form.

9. The wavelength tunable laser apparatus of claim 1, wherein the substrates are coupled by using a lens or an adhesive.

10. The wavelength tunable laser apparatus of claim 1, wherein a thermo-electric cooler for controlling temperatures of the substrates is mounted under the substrates.

* * * * *